United States Patent [19]
Roberts et al.

[11] Patent Number: 5,683,837
[45] Date of Patent: Nov. 4, 1997

[54] WATER-SOLUBLE COMPOSITIONS FOR PREPARATION OF DURABLE, HIGH-RESOLUTION PRINTING PLATES

[75] Inventors: David H. Roberts, Carlsbad; Maria Teresa A. Castillo, San Diego, both of Calif.

[73] Assignee: Napp Systems, Inc., San Morcos, Calif.

[21] Appl. No.: 621,508

[22] Filed: Mar. 25, 1996

Related U.S. Application Data

[63] Continuation of Ser. No. 342,172, Nov. 18, 1994, abandoned.

[51] Int. Cl.$^6$ .................................................. G03C 3/00
[52] U.S. Cl. ..................... 430/18; 430/281.1; 430/287.1; 430/288.1; 430/300
[58] Field of Search .................................. 430/18, 281.1, 430/300, 287.1, 288.1; 522/117, 121

[56] References Cited

U.S. PATENT DOCUMENTS

| | | | |
|---|---|---|---|
| 2,929,710 | 3/1960 | Martin | 430/287.1 |
| 3,427,161 | 2/1969 | Laridon et al. | 430/287.1 |
| 4,042,386 | 8/1977 | Okai et al. | 430/300 |
| 4,272,611 | 6/1981 | Vyvial et al. | 430/281.1 |
| 4,355,093 | 10/1982 | Hartmann et al. | 430/300 |
| 4,517,277 | 5/1985 | Lynch et al. | 430/281.1 |
| 5,185,083 | 2/1993 | Smigo et al. | 210/735 |

FOREIGN PATENT DOCUMENTS

| | | |
|---|---|---|
| 834337 | 5/1960 | United Kingdom. |
| 1233883 | 6/1971 | United Kingdom. |
| 1351475 | 5/1974 | United Kingdom. |

*Primary Examiner*—George F. Lesmes
*Assistant Examiner*—Laura Weiner
*Attorney, Agent, or Firm*—Gray Cary Ware & Freidenrich; Stephen E. Reiter

[57] ABSTRACT

In accordance with the present invention, water-developable photopolymerizable compositions useful for the preparation of durable printing plates capable of providing very high levels of resolution have been developed. Printing plates prepared employing invention compositions, once photopolymerized, have excellent physical properties, enabling their use in many very demanding applications, e.g., commercial letterpress and newspaper printing. Such applications require the photopolymerized resin to provide a sharp image and good durability after curing. Photopolymerization of invention resin yields a product with excellent physical characteristics, acceptable by letterpress printing standards. In addition, photopolymerization of invention composition provides a product which demonstrates sufficient toughness to be used for extended printing runs as required in such areas as metal decorating, newspaper, plastic packaging, business forms, and the like.

12 Claims, 1 Drawing Sheet

WATER-SOLUBLE COMPOSITIONS FOR PREPARATION OF DURABLE, HIGH-RESOLUTION PRINTING PLATES

This application is a continuation of application U.S. Ser. No. 08/342,172, filed Nov. 18, 1994, now abandoned, the entire contents of whcih are hereby incorporated by reference herein.

The present invention relates to water-developable photosensitive printing plates and compositions useful for the preparation thereof.

BACKGROUND OF THE INVENTION

Photosensitive resins used for the manufacture of relief printing plates are preferably developable with water rather than organic solvent. This is true for various reasons, such as ease of handling, health of workers who come in contact therewith, safety, and avoidance of environmental pollution. Photosensitive resins used for the manufacture of relief printing plates must also be capable of providing a sharp, preferably durable image, especially when the desired end use is in letterpress applications.

Various photosensitive resins have been employed for the preparation of printing plates. The photosensitive resin compositions employed for conventional photosensitive resin plates are based on liquid unsaturated polyesters, polyvinyl alcohols, chemically modified polyvinyl alcohols, water soluble polyamides, cellulose acetate succinates, alcohol soluble polyamides, etc. All these materials, however, suffer from disadvantages. For instance, liquid unsaturated polyesters are inconvenient to handle and necessitate the use of an alkaline solution or a special air knife for developing. Cellulose acetate succinates require the use of an alkaline solution for development, and alcohol soluble polyamides typically require the use of an inflammable alcohol. Chemically modified polyvinyl alcohols require additional preparation steps, in order to introduce the chemical modifying group(s), before the modified polymer can be incorporated into the photosensitive resin composition.

Numerous other water-developable, photo-polymerizable compositions have been developed for the preparation of photosensitive resin plates. Each suffers from certain drawbacks, e.g., lack of sufficient structural integrity to withstand the physical rigors of commercial printing operations, requiring the use of expensive (exotic) raw materials (such as the base polymers employed for the preparation of such resins), and/or requiring the use of modified polymer systems which are expensive and time and labor intensive to prepare, and the like. Accordingly, what is still needed in the art are photopolymerizable resins having improved chemical and physical properties which can be prepared from readily available starting materials.

BRIEF DESCRIPTION OF THE INVENTION

In accordance with the present invention, we have developed novel water-developable photopolymerizable compositions useful for the preparation of durable printing plates capable of providing very high levels of resolution. Printing plates prepared employing invention compositions, once photopolymerized, have excellent physical properties, enabling their use in many very demanding commercial applications, e.g., commercial letterpress and newspaper printing. Such applications require the photopolymerized resin to provide a sharp image and good durability after curing. Photopolymerization of invention resin yields a product with excellent physical characteristics, acceptable by letterpress printing standards. In addition, photopolymerization of invention composition provides a product which demonstrates sufficient toughness to be used for extended printing runs as required in such areas as metal decorating, plastic packaging, newspaper printing, printing of business forms, and the like.

BRIEF DESCRIPTION OF THE FIGURES

FIG. 1 collectively illustrates the juncture between the face (top surface) and the shoulder of a character formed by photopolymerized polymeric compositions. FIG. 1A illustrates the structure desired for a "sharp" image, while

DETAILED DESCRIPTION OF THE INVENTION

Figure 1B:
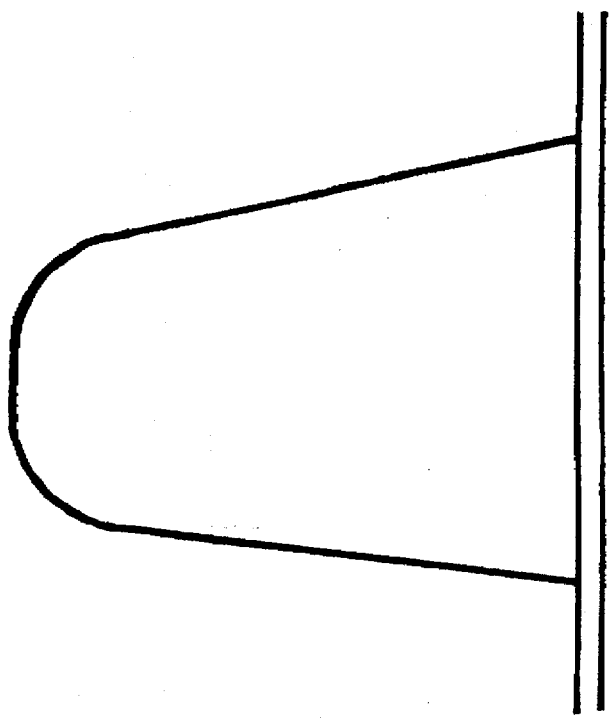
FIG. 1B illustrates a structure which gives rise to a poorly defined image.

In accordance with the present invention, there are provided solid water-developable photopolymerizable compositions, which upon exposure to electromagnetic radiation form water insoluble polymer(s). Invention compositions comprise:

a polymer system comprising an amine-containing polymer having the structure:

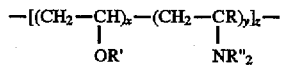

wherein:

each R is independently selected from H or methyl, each R' is independently selected from H or acetyl, each R" is independently selected from H, formyl or $C_1$ up to $C_4$ alkyl, x falls in the range of about 1 up to 200 times greater than y, and z falls in the range of about 200 up to 1000, in the range of about 1 up to 15 wt % aqueous medium, in the range of about 10 up to 60 wt % of at least one monomer, and in the range of about 0.1 up to 3 wt % of at least one photoinitiator, wherein wt % in all instances is based on the total weight of the composition.

Polymer systems contemplated for use in the practice of the present invention comprise amine-containing polymer as defined above, optionally blended with substituted or unsubstituted polyvinyl alcohol (PVA). Where there is a relatively low concentration of amine groups per ethylidene repeat unit of the amine-containing polymer, the polymer system will typically contain little, if any, PVA "diluent"; while a substantial portion of the polymer system may comprise PVA as diluent where there is a relatively high concentration of amine groups per ethylidene repeat unit of the amine-containing polymer. Typically, the mol % amine functionality present in the polymer system of the present invention will fall in the range of about 0.3 up to 2.0, with in the range of about 0.7 up to 1.3 mol % amine functionality in the polymer system preferred. It is presently especially preferred that the mol % of amine functionality in the polymer system employed in the practice of the present invention fall in the range of about 0.8 up to 1.0.

The desired concentration of amine functionality can be provided by a blend of amine-containing polymer with PVA, or by an amine-containing polymer which directly provides the desired level of amine functionality. Since amine-containing polymers are readily available having a wide range of amine contents, blends containing various ratios of amine-containing polymer and PVA can be prepared for use in the practice of the present invention.

As employed herein, "polyvinyl alcohol" refers to hydrolyzed polyvinyl acetate, having a degree of hydrolysis in the range of about 60 up to 95% (i.e., having about 60–95% free hydroxyl groups and 5–40% residual acetate groups). Preferably, polyvinyl alcohols having in the range of about 72–88% free hydroxyls will be employed. Polyvinyl alcohols having a wide range of molecular weights can be employed in the practice of the present invention. Polymeric species having a MW in the range of about 2,000 up to 100,000 are suitable, while presently preferred polymeric species will have a molecular weight in the range of about 5,000 to 50,000, with molecular weights in the range of about 10,000 up to 30,000 being especially preferred. In addition, as recognizedby those of skill in the art, PVAs employed in the practice of the present invention can be modified, for example, by ethoxylation (see, for example, U.S. Pat. No. 4,272,611, incorporated by reference herein), by copolymerization of vinyl acetate with acrylates or methacrylates (for example, with itaconic acid), by copolymerization of vinyl acetate with vinyl amines (for example, vinylformamide), by esterification with methacrylic anhydride (see, for example, U.S. Pat. No. 4,517,277, incorporated by reference herein), and the like.

Amine-containing polymers contemplated for use in the practice of the present invention are polymers having the structure:

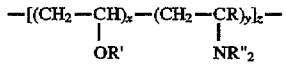

wherein:

each R is independently selected from H or methyl, each R' is independently selected from H or acetyl, each R" is independently selected from H, formyl or $C_1$ up to $C_4$ alkyl, x falls in the range of about 1 up to 200 times greater than y, and z falls in the range of about 200 up to 1000.

Those of skill in the art recognize that the above-described amine-containing polymer can be terminated in a variety of ways, e.g., by disproportionation, by recombination with reactive groups which are also present in the reaction media, e.g., hydrogen radicals, methyl radicals, another growing polymeric chain, and the like. Exemplary amine-containing polymers are those wherein each R is H, at least 70% of the R' moieties are H, R" is selected from H or methyl, the ratio of x to y is selected so that the concentration of amine groups per ethylidene repeat unit of the amine-containing polymer falls in the range of about 0.3 up to 2.0 mol %, and z falls in the range of about 250 up to 750. Presently preferred amine-containing polymers are those wherein each R is H, at least 95% of the R' moieties are H, R" is H, the ratio of x to y is selected so that the concentration of amine groups per ethylidene repeat unit of the amine-containing polymer falls in the range of about 0.7 up to 1.3 mol %, and z falls in the range of about 250 up to 500.

The above-described amine-containing polymers can be readily prepared by those of skill in the art. For example, vinyl acetate can be copolymerized with vinyl formamide, followed by hydrolysis of the formamide and acetate functions, to produce the above-described polymer. See, for example, Japanese patent application no. JP 042 55702A (Kuraray Co. Ltd., published Sep. 10, 1992).

As employed herein, the term "aqueous medium" contemplates water alone, as well as mixtures of water and organic media such as $C_1$–$C_4$ alcohols (in a ratio anywhere from 1 part water per 10 parts alcohol up to 10 parts water per 1 part alcohol). Aqueous medium is typically employed in the range of about 1 up to 15 wt %; with media levels in the range of about 2–10 wt % being preferred; with 3–6 wt % aqueous media being presently preferred.

Typically, in the practice of the present invention, in the range of about 10 up to 60 wt % of at least one monomer is employed as part of the photopolymerizable composition. Preferably, in the range of about 20 up to 50 wt % monomer is employed, with in the range of about 35 up to 40 wt % being presently preferred.

As used herein, reference to "at least one monomer" embraces monounsaturated, monofunctional monomeric species, as well as unsaturated, polyfunctional monomeric species. As used herein, the term "monounsaturated, monofunctional monomeric species" refers to compounds having only one α, β-ethylenic site of unsaturation, and embraces a variety of acrylate and methacrylate compounds such as glycerol mono(meth)acrylate (i.e., glycerol monoacrylate or glycerol monomethacrylate), β-hydroxyethyl (meth) acrylate, β-hydroxypropyl (meth) acrylate, 4-hydroxybutyl (meth) acrylate, carboxyethyl acrylate (β-CEA), carboxyethyl methacrylate, dimethylaminopropyl (meth) acrylamide, and the like.

As used herein, the term "unsaturated, polyfunctional monomeric species", refers to compounds having more than one α, β-ethylenic site of unsaturation, and embraces such compounds as diethylene glycol di(meth)acrylate, triethylene glycol di(meth)acrylate, tetraethylene glycol di(meth) acrylate, neopentyl glycol di(meth)acrylate, glycerol di(meth)acrylate, epoxy (meth)acrylates of glycols, aliphatic or aromatic urethane acrylates, and the like.

Those of skill in the art recognize that a wide range of photopolymerization initiators Can be used in the practice of the present invention. As used herein, reference to "photoinitiator" embraces ordinary photoreaction initiators such as α-diketone compounds (e.g., diacetyl, benzil, benzil ketals, and the like), acyloins (e.g., benzoin, pivaloin, and the like), acyloin ethers (e.g., benzoin methyl ether, benzoin ethyl ether, benzoin propyl ether, benzoin vinyl ether, benzoin allyl ether, and the like), polynuclear quinones (anthraquinone, 1,4-naphthoquinone), benzophenone, hydroxy acetophenones, acyl phosphine oxides, and the like. Such compounds are typically employed at levels in the range of about 0.1 up to 3.0 wt %. Preferably, in the range of about 0.4 up to 2.3 wt % of initiator will be employed, with in the range of about 0.5 up to 1.0 presently preferred. The presently preferred initiator for use in the practice of the present invention is benzil dimethyl ketal.

Additional components contemplated for inclusion in the compositions of the invention include polymerization inhibitors (e.g., hydroxyaromatic compounds (e.g., hydroquinone, hydroquinone methyl ether (MEHQ), p-methoxyphenol, p-t-butylcatechol, 2,6-di-t-butyl-p-cresol, pyrogallol, butylated hydroxytoluene (BHT), butylated hydroxyaniline (BHA), and the like); quinones (e.g., benzoquinone, p-toluquinone, p-xyloquinone, and the like); amines (e.g., N-phenyl-α-naphthylamine, and the like); imidazoles (e.g., methyl-benzimidazole); and the like); thiazenes (e.g., phenothiazene); defoaming agents, surfactants, dyes, ultraviolet light absorbers, and the like. Invention compositions may also contain a plasticizer, which acts to reduce the glass transition temperature of the polymer, thereby improving the flexibility of the resulting composition. Examples of plasticizers useful in the practice of the present invention include glycerin, ethylene glycol, ethoxylated phenols, ethoxylated glycerin, and the like.

Invention composition may further contain additives to improve processability and handling characteristics thereof, such as, for example, lubricating agents. Such additives include, for example, polyethylene waxes, paraffins, esters of stearic acid (such as sorbitol monostearate), ethylene—acrylic acid copolymers, polyhydroxy styrene, and the like.

One of the desirable characteristics of invention compositions is their developability with water of substantially neutral pH. Thus, there is no need to use pH modified (i.e., acidic or basic) media when developing invention compositions. Another desirable characteristic of invention compositions is the high photosensitivity thereof, thus such resins require only a short time for light exposure to accomplish the crosslinking thereof.

Invention compositions can be developed with water in 1 to 10 minutes or longer, depending on the water temperature, specific resin composition, resin thickness, and the like. Preferably, invention compositions are developed for in the range of about 1 up to 5 minutes. After the resin is developed, it is dried in suitable fashion, optionally subjected to a post-cure exposure to strengthen the resin. Photocured and developed compositions can be used for printing immediately after drying and optional post-cure (which involves additional exposure of the dried plate to appropriate wavelength radiation for about 0.1 up to 20 minutes or longer).

In accordance with another embodiment of the present invention, there are provided solid water-developable photosensitive resin plates comprising a support having deposited thereon a layer of the above-described photopolymerizable composition. Invention resin plates are characterized by:
  producing a sharp image, as determined by the method described in Example 2A, after photo-polymerization and development thereof,
  being relatively insensitive to variations in processing conditions employed for washout the photopolymerizable composition, and
  producing a durable printing surface after photopolymerization and development thereof.

Resin compositions of the present invention produce resin plates having the above-described excellent physical performance properties, while avoiding the need for high cost starting materials. Instead, invention compositions can be prepared from relatively low-cost, off-the-shelf starting materials (e.g., standard grade polyvinyl alcohol, and readily prepared amine-containing variants thereof).

Figure 1A:
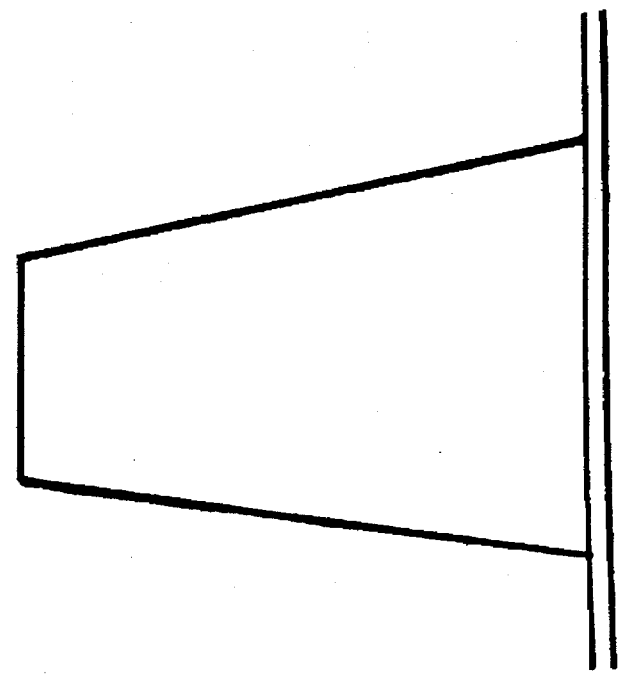

A "sharp image" (determined by the method described in Example 2A), after photo-polymerization and development thereof, refers to the profile of letters and isolated dots (referred to hereinafter as characters) on a developed plate. The juncture between the face (top surface) and the shoulder of the character is evaluated. The point where the character face meets the shoulder should be well defined, the face of the character dropping-off crisply to the shoulder (as illustrated in FIG. 1A). Unacceptable image sharpness is demonstrated by characters which are "rounded", i.e., the point where the character face meets the shoulder is not angular and well defined, but forms an arc (as illustrated in FIG. 1B).

A particularly stringent test of image sharpness is the highlight dot holding test, wherein a high density grid of dot images is produced on a test plate, then observed to see how well the dot shape is retained after development of the plate. The finer the size of dots that can be retained, the greater the resolution which can be achieved. See Example 2B for a detailed description of how the highlight dot holding test is carried out. It is consistently observed that plates made with invention resin display improved dot holding properties, relative to plates made with prior art resins (see, for example, the Table presented following Example 1.

Another advantage of invention resins is the relative insensitivity of such resins to variations in processing conditions employed for washout of the photopolymerizable composition. Thus, invention compositions can be washed out over a wide range of conditions (e.g., water temperature and wash times when developing the photopolymerized resins), without substantially affecting the properties of the resulting product.

Yet another advantage of invention resins is the production of a durable printing surface after photopolymerization and development thereof. Thus, invention compositions can be used in a variety of applications which entail long-term printing runs, high stress applications, and the like.

Supports contemplated for use in the practice of the present invention can be prepared of a variety of materials, e.g., metal, plastic, paper, wood, glass, and the like. Exemplary support materials include steel, aluminum and plastic (e.g., polyethylene terephthalate, Mylar, and the like).

"Depositing" of the above-described compositions onto support can be carried out in a variety of ways, e.g., by extrusion, roll coating, heat processing, solvent casting, and the like. These techniques can be readily carried out by those of skill in the art.

The thickness of the layer of photopolymerizable composition applied in the preparation of invention photosensitive resin plates can vary widely. Typically, a resin thickness of at least 7 mils (i.e., 0.007 inches) will be applied, with resin thickness of up to about 250 mils contemplated. Preferably, resin thicknesses in the range of about 5 up to 100 mils will be employed, with current commercial plates typically having a thickness in the range of about 10 up to 70 mils.

In accordance with a presently preferred aspect of the invention, an adhesive layer is applied to the support before the layer of photopolymerizable composition is deposited in the support. Suitable materials for use in preparing and applying such adhesive layers are well known in the art. See, for example, U.S. Pat. No. 3,360,746 (incorporated by reference herein), and the Examples which follow.

In accordance with another preferred aspect of the invention, a matte coat is applied on top of the layer of photopolymerizable composition once said composition has been deposited on the support. Suitable materials for use in preparing and applying such matte coatings are well known in the art. See, for example, U.S. Pat. No. 4,126,460, incorporated by reference herein, as well as the Examples which follow.

In accordance with yet another embodiment of the present invention, there are provided relief printing plates comprising support having deposited thereon a photopolymerized layer of photopolymerizable composition of the invention at a thickness of at least 7 mils. invention printing plates are characterized as described above in terms of producing a sharp image, being relatively insensitive to variations in processing conditions employed for washout of the photopolymerizable composition, and producing a durable printing surface after photopolymerization and development thereof.

In accordance with another embodiment of the present invention, there is provided a method for preparing water-developable photosensitive relief printing plates, said method comprising depositing onto a suitable support a substantially homogeneous photopolymerizable composition as described above at a thickness of at least 7 mils. The resulting plates are characterized as described above in terms of producing a sharp image, being relatively insensitive to variations in processing conditions employed for washout of the photopolymerizable composition, and producing a durable printing surface after photopolymerization and development thereof.

In accordance with yet another embodiment of the present invention, there is provided a method for preparing a relief printing plate, said method comprising:

exposing a photosensitive resin plate as described above through a negative film having an image thereon to electromagnetic radiation of sufficient energy to promote the polymerization of said resin, and washing said plate with a sufficient quantity of water to remove the photosensitive resin composition from the non-exposed portions of said plate, wherein said plate is characterized, after photopolymerization and development thereof, as described above in terms of producing a sharp image, being relatively insensitive to variations in processing conditions employed for washout of the photopolymerizable composition, and producing a durable printing surface.

The invention will now be described in greater detail by reference to the following non-limiting examples.

EXAMPLE 1

Preparation of Photopolymerizable Compositions

Invention Composition I 85 parts by weight of polyvinyl alcohol having an average degree of polymerization of about 350 and a number average hydrolysis value of about 79, and 15 parts by weight of a 6 mol % amine-containing polymer having a degree of polymerization of 750 and a number average hydrolysis value of approximately 99, was dissolved in 85 parts by weight of water containing 0.006% of a dye (e.g., resin) in a resin kettle. The polymer solution was then adjusted to approximately 70° C., and 75 parts by weight of the following monomer solution added thereto:

35 parts 4-hydroxybutyl acrylate, 20 parts tetraethylene glycol diacrylate, 18 parts glycerol monomethacrylate, 1.5 parts benzil dimethyl ketal, and 0.5 parts hydroquinone monomethyl ether.

The temperature was maintained at 70° C. and the components were mixed for 0.5 hour.

The resin composition was molded onto a coated steel support to a thickness of 25 mils (1 mil=0.001 inch) using calender rolls, then dried at ~80° C. in a forced air oven down to a residual water content in the range of about 3–6 wt %. The coated steel support comprises a steel support having deposited thereon (for example, by roll coating) ~65 micron wet thickness of an adhesion layer of a composition containing pigment (for anti-reflectance), PVA and acrylic latex. The dried resin film on the coated steel support was then exposed to ultraviolet light provided by a fluorescent cold lamp through a negative. The negative was removed and the printing plate washed with plain water to remove the non-polymerized areas of the resin. The resulting relief plates are dried (for about 10 minutes), and post-cured for about 5 minutes.

Evaluation of the relief images obtained shows that the shoulder angles were sharply defined (see FIG. 1A), and 100% of the 2.0 mil highlight dots were held.

Invention Composition II

A resin composition was prepared as described above for the preparation of Invention Composition I, except for the use of 92.5 parts by weight of polyvinyl alcohol having an average degree of polymerization of 360 and a number average hydrolysis value of 79 (instead of 85 parts by weight of polyvinyl alcohol having an average degree of polymerization of about 350 and a number average hydrolysis value of about 79) and 7.5 parts by weight of a 6 mol % amine-containing polymer having a degree of polymerization of 750 and a number average hydrolysis value of approximately 99 (instead of 15 parts by weight of a similarly defined 6 mol % amine-containing polymer). The resin composition was molded onto a coated steel support as described for Invention Composition I, except the film was molded at a thickness of only 23 mils.

The film was then imaged and processed as described for the analysis of Invention Composition I. The shoulder angles were sharply defined (see FIG. 1A) and 100% of the 2.0 mil highlight dots were held.

Comparative Composition A

The procedure employed for the preparation of Invention Composition I was repeated, except that polyvinyl alcohol having an average degree of polymerization of about 800 and a number average hydrolysis value of about 88 was substituted for the amine-containing polymer in the formulation.

The film is imaged and developed as described above for the evaluation of Invention Composition I. The shoulder angles of the resulting images were somewhat rounded (see FIG. 1B), and 1% of the 2.0 mil highlight dots were missing.

Comparative Composition B

The procedure employed for the preparation of Invention Composition I was repeated, except that polyvinylpyrrolidone (K-30, available from GAF Chemicals Corporation, Wayne, N.J.) was substituted for the amine-containing polymer in the formulation.

The film is imaged and developed as described above for the evaluation of Invention Composition I. Evaluation of the relief image shows that the shoulder angles were somewhat rounded (see FIG. 1B) and 6% of the 2.0 mil highlight dots were missing.

Comparative Composition C

The procedure employed for the preparation of Invention Composition I was repeated, except that a 6 mol % amine hydrochloride salt-containing PVA-type polymer (i.e., the HCl salt of a vinyl alcohol/vinyl amine copolymer— Experimental Product No. 692-11890-1615, available from Air Products & Chemicals, Inc., Allentown, Pa.) having a degree of polymerization of 750 and a number average hydrolysis value of approximately 99 was substituted for the amine-containing polymer required for the practice of the present invention.

The film is imaged and developed as described above for the evaluation of Invention Composition I. While the plate exhibits acceptable image sharpness, approximately 2% of the 2.0 mil highlight dots were missing.

Invention Composition III 80 parts by weight of polyvinyl alcohol having an average degree of polymerization of about 340 and a number average hydrolysis value of about 82, and 20 parts by weight of a 6 mol % amine-containing polymer having a degree of polymerization of 750 and a number average hydrolysis value of approximately 99, was dissolved in 85 parts by weight of water containing 0.006% of a dye (e.g., eosin) in a resin kettle. The polymer solution was then adjusted to approximately 70° C., and 61 parts by weight of the following monomer solution added thereto:

37 parts 4-hydroxybutyl acrylate, 11 parts tetraethylene glycol diacrylate, 11 parts glycerol monomethacrylate, 1.5 parts benzil dimethyl ketal, and 0.5 parts hydroquinone monomethyl ether.

The temperature was maintained at 70° C. and the components were mixed for 0.5 hour. The resin composition was then molded onto a coated steel support as described for Invention Composition I.

The film was then imaged and processed as described for the analysis of Invention Composition I. Evaluation of the relief images obtained shows that the shoulder angles were sharply defined (see FIG. 1A) and 100% of the 2.0 mil highlight dots were held.

Comparative Composition D

The procedure employed for the preparation of Invention Composition III was repeated, except that polyvinyl alcohol having an average degree of polymerization of about 500 and a number average hydrolysis value of about 70 was substituted for the amine-containing polymer in the formulation, and 5.6 parts by weight of urea was added to the monomer solution.

The film is imaged and developed as described above for the evaluation of Invention Composition III. The shoulder angles of the resulting images were rounded (see FIG. 1B), and 25% of the 2.0 mil highlight dots were missing.

Comparative Composition E

The procedure employed for the preparation of Invention Composition III was repeated, except that polyvinyl alcohol having an average degree of polymerization of about 500 and a number average hydrolysis value of about 70 was substituted for the amine-containing polymer in the formulation.

The film is imaged and developed as described above for the evaluation of Invention Composition III. Evaluation of the relief image shows that the image sharpness was reasonably well defined, but 8% of the 2.0 mil highlight dots were missing.

The results of the above evaluations are summarized in the following table.

TABLE

Summary of Properties of Invention and Comparative Compositions

| | Image Sharpness | Percentage of 2.0 mil dots missing (@ 120 lines/inch) |
|---|---|---|
| Invention Comp. I | sharply defined | None |
| Invention Comp. II | sharply defined | None |
| Comparative Comp. A | somewhat rounded | 1% |
| Comparative Comp. B | somewhat rounded | 6% |

TABLE-continued

Summary of Properties of Invention and Comparative Compositions

| | Image Sharpness | Percentage of 2.0 mil dots missing (@ 120 lines/inch) |
|---|---|---|
| Comparative Comp. C | sharply defined | 2% |
| Invention Comp. III | sharply defined | None |
| Comparative Comp. D | rounded and poorly defined | 25% |
| Comparative Comp. E | sharply defined | 8% |

EXAMPLE 2

Test Evaluation Methods

A. Image Sharpness Assessment

Image sharpness assessment is based on the appearance of the profile of letters and isolated dots on a developed plate, the letters and isolated dots being referred to hereinafter as characters. The juncture between the face (top surface) and the shoulder of the character is evaluated. The point where the character face meets the shoulder should be well defined, the face of the character dropping-off crisply to the shoulder (as illustrated in FIG. 1A). Unacceptable image sharpness is demonstrated by characters which are "rounded", i.e., the point where the character face meets the shoulder is not angular and well defined, but forms an arc (as illustrated in FIG. 1B).

B. Highlight Dot Holding Assessment

Highlight dot holding is assessed by inspection of the 2% 120 lines per inch (lpi) highlight dots with an optical microscope. The dots are viewed from directly above at 5× or 10× magnification, with the focus set for the top of the dots. The number of missing dots are then manually counted and the percent missing calculated based on the total number of dots in the field of view. Four different regions of 2% highlight dots are viewed to ensure a representative accounting.

While the invention has been described in detail with reference to certain preferred embodiments thereof, it will be understood that modifications and variations are within the spirit and scope of that which is described and claimed.

That which is claimed is:

1. A solid water-developable photopolymerizable composition, which upon exposure to electromagnetic radiation forms a water insoluble polymer, said composition comprising:

(a) a polymer system comprising an amine-containing polymer having the structure:

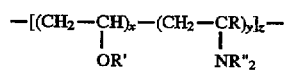

wherein:

each R is independently selected from H or methyl, each R' is independently selected from H or acetyl, each R" is independently selected from H, formyl or $C_1$ up to $C_4$ alkyl, x falls in the range of 1 up to 200 times greater than y, and z falls in the range of 200 up to 1000, wherein said composition further comprises:

(b) in the range of 1 up to 15 wt % aqueous medium,
(c) in the range of 10 up to 60 wt % of at least one ethylenically unsaturated monomer, and
(d) in the range of 0.1 up to 3 wt % of at least one photoinitiator, wherein wt % in all instances is based on the total weight of the composition; and wherein said composition is further characterized as being suitable for the preparation of a relief printing plate comprising a support having deposited thereon a photopolymerized layer of said composition at a thickness of at least 7 mils, wherein said plate is characterized by:

producing a sharp image, after photopolymerization and development thereof, being relatively insensitive to variations in processing conditions employed for washout of said composition, and producing a durable printing surface after photopolymerization and development thereof.

2. A composition according to claim 1 wherein the concentration of amine groups per ethylidene repeat unit of all polymer components comprising the polymer system falls in the range of about 0.3 up to 2.0 mol %, each R is H, at least 95% of the R' moieties are H, each R" is H, the ratio of x to y is selected so that the concentration of amine groups per ethylidene repeat unit of the amine-containing polymer falls in the range of about 0.3 up to 2.0 mol %, and z falls in the range of about 250 up to 500.

3. A composition according to claim 1 wherein said aqueous medium is water, and is present in the range of about 2 up to 10 wt %.

4. A composition according to claim 1 wherein said ethylenically unsaturated monomer is present in the range of about 15 up to 40 wt %.

5. A composition according to claim 1 wherein said ethylenically unsaturated comprises at least one monounsaturated, monofunctional monomeric compound and at least one unsaturated, polyfunctional monomeric compound.

6. A composition according to claim 5 wherein said monounsaturated, monofunctional monomeric compound is selected from glycerol mono(meth)acrylate, β-hydroxyethyl (meth)acrylate, β-hydroxypropyl (meth)acrylate, 4-hydroxybutyl (meth)acrylate, carboxyethyl acrylate (β-CEA), carboxyethyl methacrylate, dimethylaminopropyl (meth)acrylamide, or combinations of any two or more thereof.

7. A composition according to claim 5 wherein said unsaturated, polyfunctional monomeric compound is selected from diethylene glycol di(meth) acrylate, triethylene glycol di(meth)acrylate, tripropylene glycol di(meth) acrylate, tetraethylene glycol di(meth)acrylate, butane diol di(meth)acrylate, neopentyl glycol di(meth)acrylate, glycerol di(meth)acrylate, epoxy (meth)acrylates of glycols, aliphatic urethane (meth)acrylates, aromatic urethane (meth)acrylates, or mixtures of any two or more thereof.

8. A composition according to claim 5 wherein said ethylenically unsaturated monomer is present in the range of about 20 up to 50 wt %.

9. A composition according to claim 1 wherein said photoinitiator is selected from α-diketone compounds, acyloins, polynuclear quinones, or mixtures of any two or more thereof.

10. A composition according to claim 9, wherein said photoinitiator is an acyloin selected from acyloin ethers, benzophenone, hydroxy acetophenones, acyl phosphine oxides, or mixtures of any two or more thereof.

11. A composition according to claim 1 wherein said photoinitiator is present in the range of about 0.4 up to 2.3 wt %.

12. A composition according to claim 1 further comprising inhibitors, defoaming agents, surfactants, dyes, ultraviolet light absorbers, plasticizers, lubricating agents, or mixtures of any two or more thereof.

* * * * *